(12) United States Patent
Mobley

(10) Patent No.: US 7,085,186 B2
(45) Date of Patent: Aug. 1, 2006

(54) METHOD FOR HIDING A REFRESH IN A PSEUDO-STATIC MEMORY

(75) Inventor: Kenneth J. Mobley, Colorado Springs, CO (US)

(73) Assignee: Purple Mountain Server LLC, Los Altos, CA (US)

( * ) Notice: Subject to any disclaimer, the term of this patent is extended or adjusted under 35 U.S.C. 154(b) by 331 days.

(21) Appl. No.: 09/828,283

(22) Filed: Apr. 5, 2001

(65) Prior Publication Data

US 2002/0147885 A1 Oct. 10, 2002

(51) Int. Cl.
*G11C 7/00* (2006.01)

(52) U.S. Cl. .................. 365/222; 365/230.03; 711/106; 711/105; 711/118; 711/150; 711/5

(58) Field of Classification Search .................. 365/222, 365/230.03; 711/106, 105, 5, 118, 150, 151, 711/158, 166, 203
See application file for complete search history.

(56) References Cited

U.S. PATENT DOCUMENTS

| | | | | |
|---|---|---|---|---|
| 4,888,733 A | | 12/1989 | Mobley | |
| 5,134,310 A | | 7/1992 | Mobley et al. | |
| 5,226,147 A | * | 7/1993 | Fujishima et al. | 711/118 |
| 5,410,507 A | * | 4/1995 | Tazunoki et al. | 365/189.09 |
| 5,511,033 A | * | 4/1996 | Jung | 365/222 |
| 5,559,750 A | * | 9/1996 | Dosaka et al. | 365/230.06 |
| 5,577,223 A | * | 11/1996 | Tanoi et al. | 711/118 |
| 5,619,468 A | * | 4/1997 | Ghosh et al. | 365/222 |
| 5,699,317 A | | 12/1997 | Sartore et al. | |
| 5,721,862 A | * | 2/1998 | Sartore et al. | 711/118 |
| 5,778,436 A | * | 7/1998 | Kedem et al. | 711/137 |
| 5,887,272 A | * | 3/1999 | Sartore et al. | 711/105 |
| 5,890,195 A | * | 3/1999 | Rao | 711/105 |
| 5,978,296 A | * | 11/1999 | Zibert | 365/222 |
| 5,991,851 A | | 11/1999 | Alwais et al. | |
| 5,999,474 A | * | 12/1999 | Leung et al. | 365/222 |
| 6,023,745 A | * | 2/2000 | Lu | 711/5 |
| 6,055,192 A | | 4/2000 | Mobley | |
| 6,064,620 A | | 5/2000 | Mobley | |
| 6,104,658 A | * | 8/2000 | Lu | 365/222 |
| 6,134,167 A | * | 10/2000 | Atkinson | 365/222 |
| 6,141,281 A | | 10/2000 | Mobley | |
| 6,147,921 A | * | 11/2000 | Novak et al. | 365/222 |
| 6,151,236 A | | 11/2000 | Bondurant et al. | |
| 6,208,577 B1 | * | 3/2001 | Mullarkey | 365/222 |
| 6,215,714 B1 | * | 4/2001 | Takemae et al. | 365/222 |
| 6,324,626 B1 | * | 11/2001 | Uenoyama et al. | 711/163 |
| 2001/0033245 A1 | * | 10/2001 | Campanale et al. | 341/200 |
| 2002/0003741 A1 | * | 1/2002 | Maesako et al. | 365/230.03 |

* cited by examiner

*Primary Examiner*—Hong Kim
(74) *Attorney, Agent, or Firm*—Townsend and Townsend and Crew LLP

(57) ABSTRACT

A method and device for hiding refresh operations during accesses to sub-arrays of a pseudo-static memory device. By refreshing sub-array$_j$ while filling the row $R_i$ (where $i \neq j$) corresponding to sub-array$_i$, refresh operations can be performed without risking that a read request will interrupt the refresh operation. Additional refresh operations of sub-array$_i$ can be performed serially with the operations of filling the row $R_i$ without delaying the overall burst read or write operation if the burst is made sufficiently long.

17 Claims, 9 Drawing Sheets

FIG.5

READ REQUEST ADDRESS — DSA₁,ROW 2

$LRR_1$ — 0 / 2

$LRR_2$ — 0

$LRR_3$ — 0

$RC_1$ — 6

$RC_2$ — 9 / 10

$RC_3$ — 12 / 13

| 1st sub-array | 2nd sub-array | 3rd sub-array | 4th sub-array |
|---|---|---|---|
| 000000000000 | 000010000000 | 000100000000 | 000110000000 |
| 000000000001 | 000010000001 | 000100000001 | 000110000001 |
| 000000000010 | 000010000010 | 000100000010 | 000110000010 |
| ⋮ | ⋮ | ⋮ | ⋮ |
| 000001111111 | 000011111111 | 000101111111 | 000111111111 |
| 001000000000 | 001010000000 | 001100000000 | 001110000000 |
| 001000000001 | 001010000001 | 001100000001 | 001110000001 |
| 001000000010 | 001010000010 | 001100000010 | 001110000010 |
| ⋮ | ⋮ | ⋮ | ⋮ |
| 001001111111 | 001011111111 | 001101111111 | 001111111111 |
| 010000000000 | 010010000000 | 010100000000 | 010110000000 |
| 010000000001 | 010010000001 | 010100000001 | 010110000001 |
| 010000000010 | 010010000010 | 010100000010 | 010110000010 |
| ⋮ | ⋮ | ⋮ | ⋮ |
| 010001111111 | 010011111111 | 010101111111 | 010111111111 |
| 011000000000 | 011010000000 | 011100000000 | 011110000000 |
| 011000000001 | 011010000001 | 011100000001 | 011110000001 |
| 011000000010 | 011010000010 | 011100000010 | 011110000010 |
| ⋮ | ⋮ | ⋮ | ⋮ |
| 011001111111 | 011011111111 | 011101111111 | 011111111111 |
| 100000000000 | 100010000000 | 100100000000 | 100110000000 |
| 100000000001 | 100010000001 | 100100000001 | 100110000001 |
| 100000000010 | 100010000010 | 100100000010 | 100110000010 |
| ⋮ | ⋮ | ⋮ | ⋮ |
| 100001111111 | 100011111111 | 100101111111 | 100111111111 |
| 101000000000 | 101010000000 | 101100000000 | 101110000000 |
| 101000000001 | 101010000001 | 101100000001 | 101110000001 |
| 101000000010 | 101010000010 | 101100000010 | 101110000010 |
| ⋮ | ⋮ | ⋮ | ⋮ |
| 101001111111 | 101011111111 | 101101111111 | 101111111111 |
| 110000000000 | 110010000000 | 110100000000 | 110110000000 |
| 110000000001 | 110010000001 | 110100000001 | 110110000001 |
| 110000000010 | 110010000010 | 110100000010 | 110110000010 |
| ⋮ | ⋮ | ⋮ | ⋮ |
| 110001111111 | 110011111111 | 110101111111 | 110111111111 |
| 111000000000 | 111010000000 | 111100000000 | 111110000000 |
| 111000000001 | 111010000001 | 111100000001 | 111110000001 |
| 111000000010 | 111010000010 | 111100000010 | 111110000010 |
| ⋮ | ⋮ | ⋮ | ⋮ |
| 111001111111 | 111011111111 | 111101111111 | 111111111111 |

FIG. 9

METHOD FOR HIDING A REFRESH IN A PSEUDO-STATIC MEMORY

FIELD OF THE INVENTION

A method and system for hiding, from an external memory controller, a refresh operation (or plural refresh operations) in a pseudo-static memory device.

BACKGROUND OF THE INVENTION

A variety of memory devices are presently available with varying characteristics. Dynamic Random Access Memory (DRAM) has the advantage that the number of gates per cell is small and the density is generally quite high. On the other hand, DRAM is disadvantageously prone to data loss if the individual rows of data are not periodically refreshed. Accordingly, known systems have used external or internal refresh circuitry to prevent data loss. External circuitry complicates the design of an external memory controller and may therefore be disadvantageous. DRAMs disadvantageously have relatively long array cycle times as compared to other memory devices (e.g., static memories) and therefore may act as a bottleneck for a processor that requests memory more quickly than the DRAM can provide it.

As an alternative, Static Random Access Memory (SRAM) devices utilize a greater number of transistors per memory cell and, as a result, do not require refreshing. Moreover, the transistor interconnections allow data to be read from and written to the device significantly more quickly than DRAMs. Unfortunately, the cost of SRAMs per bit is significantly more expensive than the cost of DRAMs per bit. Accordingly, it is often prohibitively expensive to use SRAM for a computer's main memory, and instead a small amount of SRAM is used only for a memory cache between the processor and a larger amount of DRAM.

As an alternative to both DRAM and SRAM designs, hybrid memories have been introduced that have some of the characteristics of both DRAM devices and SRAM devices. One such device is known as an "Enhanced DRAM" (EDRAM) and is described in U.S. Pat. Nos. 5,887,272, 5,721,862, and 5,699,317 (hereinafter "the '272 patent," "the '862 patent", and "the '317 patent," respectively), each naming Sartore et al. as inventors. (Those inventions have been assigned to the parent company of the assignee of the present invention.) The EDRAM devices disclosed therein provide increased data throughput by providing at least one row register (i.e., a read cache) associated with each DRAM sub-array or with each group of DRAM sub-arrays. Although an EDRAM device can achieve the higher data rate, resembling SRAM access speed, for accesses to data stored in the row register, an EDRAM device still requires externally initiated refresh operations. Column 15, lines 42–56, of the '272 patent discloses that an external signal labeled "/F" controls a refresh cycle. This characteristic requires the use of a memory controller that understands the operation of EDRAM devices and, thus, disadvantageously includes the additional circuitry for initiating those refresh cycles.

SUMMARY OF THE INVENTION

It is an object of the present invention to provide a memory device with faster access speed than a conventional DRAM device but without (1) the cost of a pure SRAM device and (2) the need for an external memory controller to initiate refresh cycles.

This object and other advantageous effects are achieved using a pseudo-static memory device that substantially hides all refresh operations from a memory controller coupled to the pseudo-static memory device. In a first embodiment, such a device internally includes a set of DRAM sub-arrays (matrices) each having plural array rows, such that at least one row in one sub-array can be refreshed while responding to an access request in another sub-array. In a second embodiment, at least one non-array row (e.g., an SRAM row or a register), external to a set of DRAM sub-arrays, is used to allow a refresh of at least one row of its corresponding sub-array when the internal controller, as opposed to an external controller, determines that a refresh would be appropriate. The at least one non-array row may either be either direct mapped or fully associative, and the size of the non-array row may be smaller than, larger than, or equal to the size of each of the plural array rows.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a schematic illustration of a pseudo-static memory architecture according to a second aspect of the present invention;

FIG. 9 illustrates the row addresses stored in each sub-array according to an addressing example.

DETAILED DESCRIPTION OF THE PREFERRED EMBODIMENT

Figure 1A:
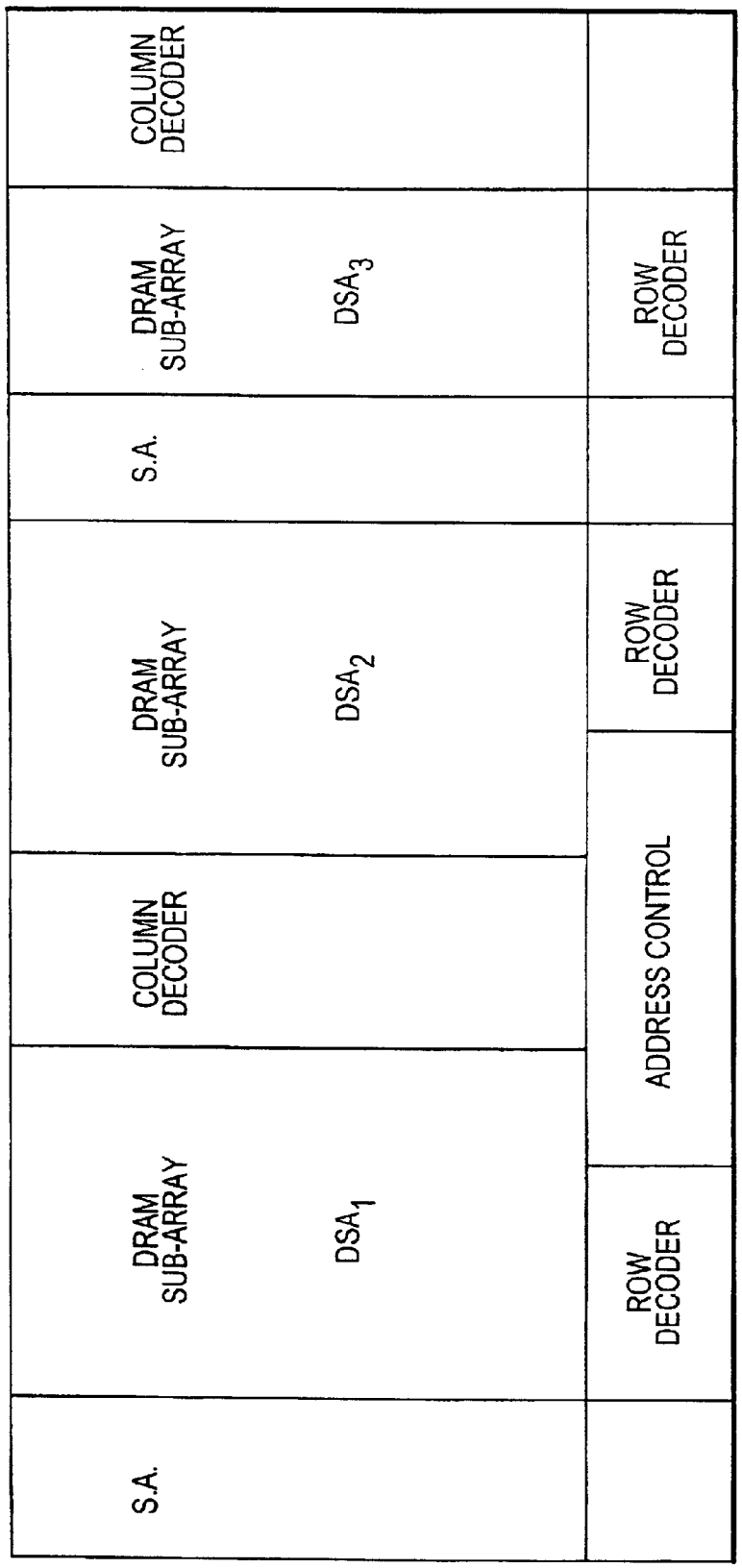
FIG. 1A is a schematic illustration of a pseudo-static memory architecture according to a first aspect of the present invention.

Referring now to the drawings, in which like reference numerals designate identical or corresponding parts throughout the several views, FIG. 1A is an illustration of a pseudo-static memory architecture according to a first aspect of a first embodiment of the present invention. Generally, the present invention includes control circuitry for performing a refresh operation in at least a first DRAM sub-array when a second DRAM sub-array is being accessed (for reading or writing).

Figure 1B:
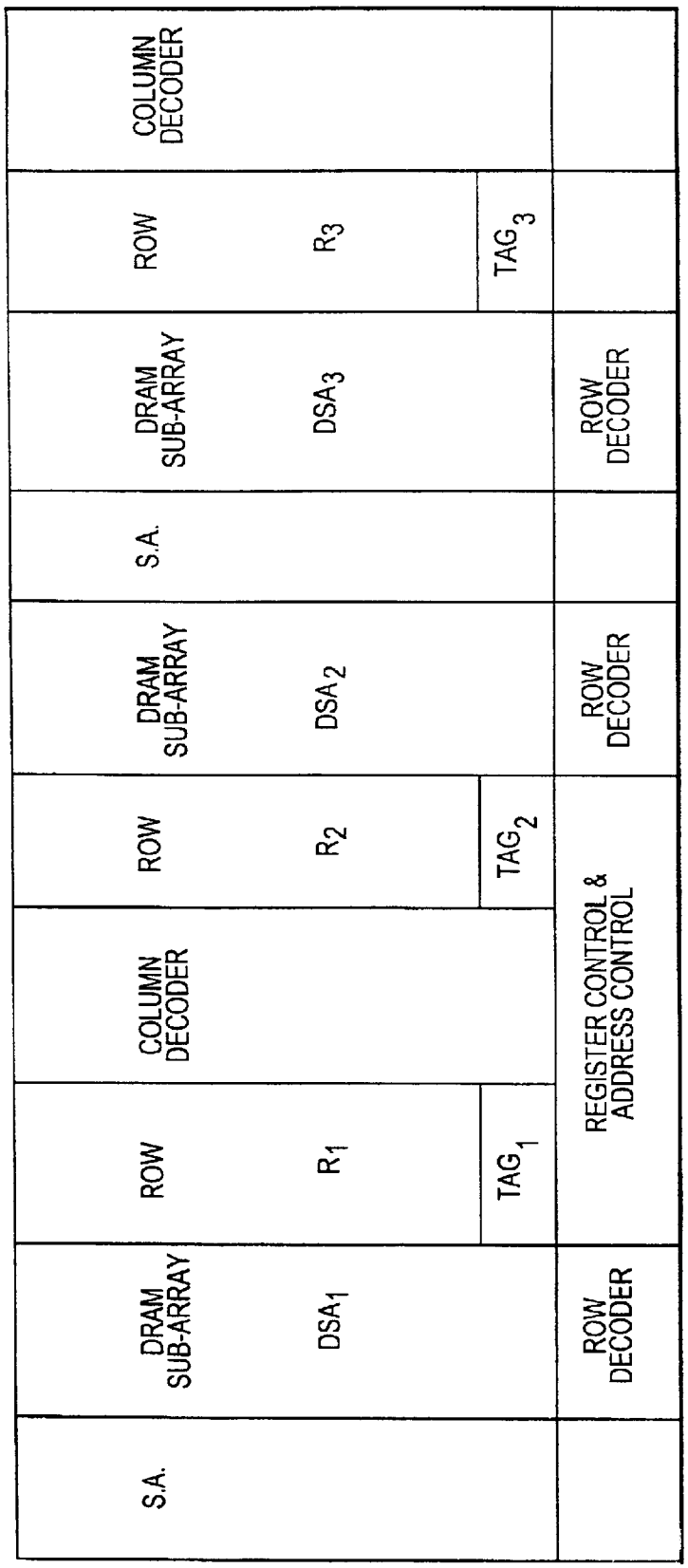
FIG. 1B is a schematic illustration of the pseudo-static memory architecture of FIG. 1A in which row registers and tag registers have been added.
Figure 7:
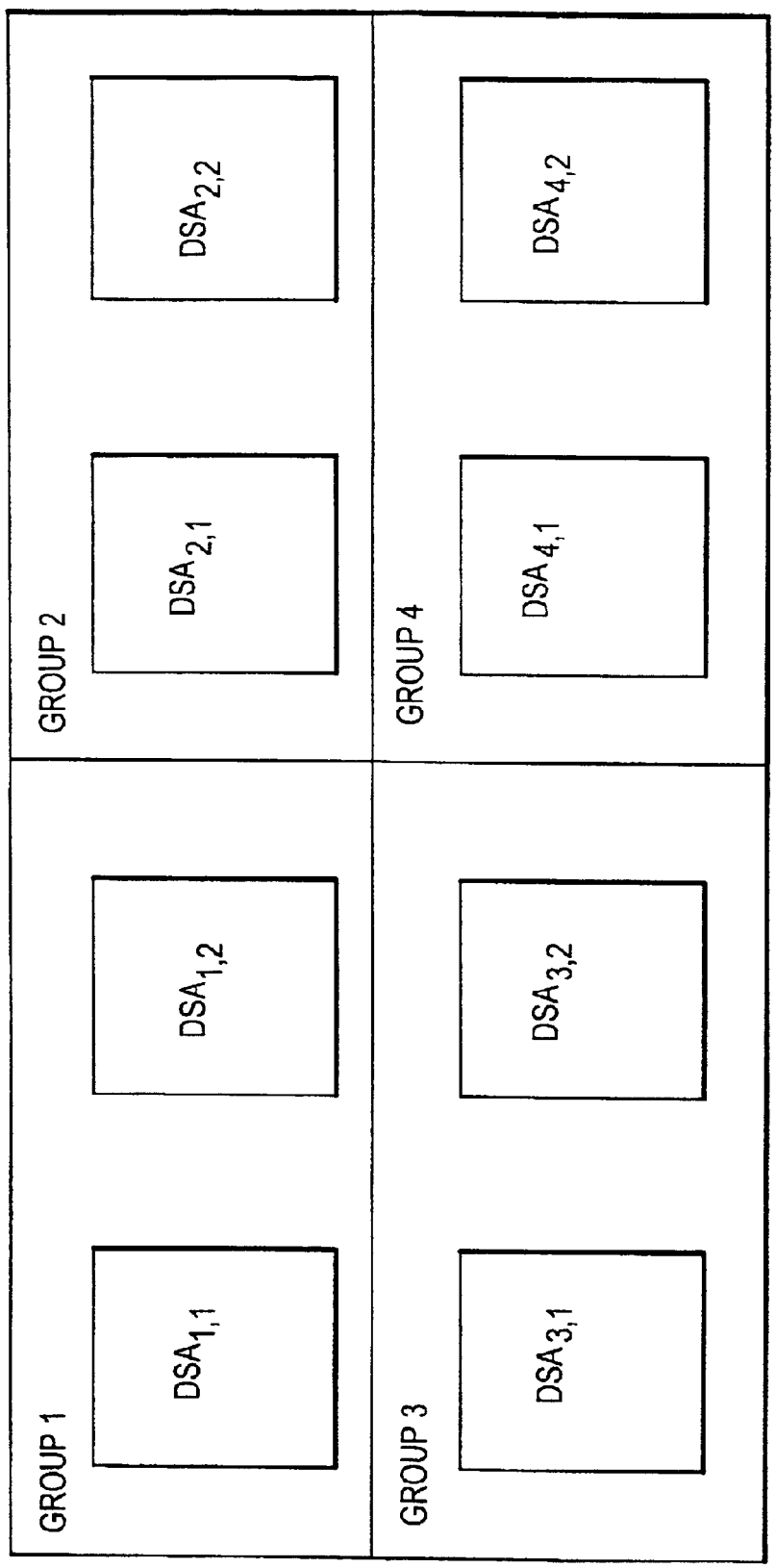
FIG. 7 is a schematic illustration of a pseudo-static memory architecture according to a third aspect of the present invention.

Turning now to FIG. 1B, in the second aspect, like the memory architecture shown in FIG. 7 of the '317 patent, a pseudo-static memory device includes both plural DRAM sub-arrays and at least one row (e.g., an SRAM row) coupled to the plural DRAM sub-arrays. The at least one row can act as an intermediate storage area for at least one of the plural DRAM sub-arrays when reading from or writing to that sub-array while contemporaneously refreshing a different DRAM sub-array.

Figure 2:
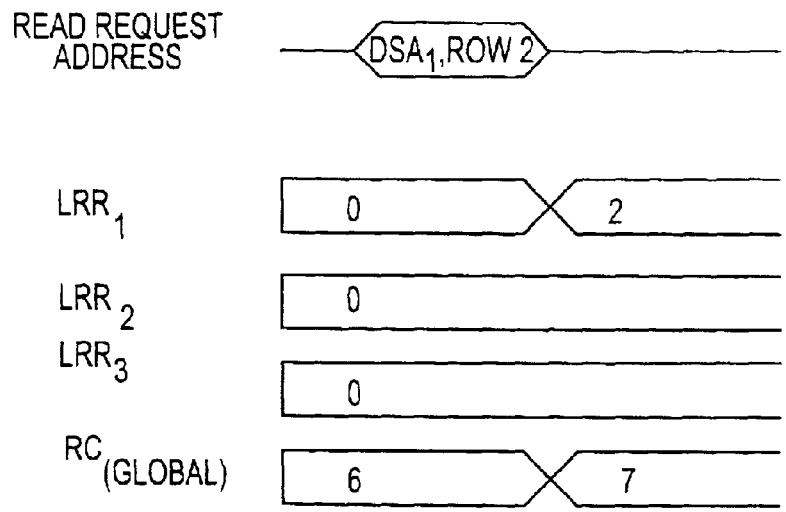
FIG. 2 is a timing diagram showing parallel read and refresh operations according to a first embodiment of the present invention.

For example, as illustrated in FIG. 2, a read operation corresponding to a memory location in the second row of the first DRAM sub-array (designated "$DSA_1$") creates a row miss since the last read row for $DSA_1$ (labeled "$LRR_1$") indicates that the last read row was row zero. Since the data is not already loaded into the row corresponding to $DSA_1$, the control circuitry of the first embodiment begins the process of loading the row corresponding to $DSA_1$ with the data of row zero. In parallel, the control circuitry of the first embodiment begins to initiate a refresh operation corresponding to at least one row in the remaining DRAM sub-arrays (i.e., in either $DSA_2$ or $DSA_3$ or both). By running a refresh cycle concurrently with an access cycle, it can be insured that the refresh cycle is not interrupted by an access to the same DRAM sub-array.

In this first embodiment, the address of the row to be refreshed is supplied from a standard refresh counter, labeled $RC_{(global)}$ in FIG. 2, during every DRAM access cycle that causes a read (or write) miss. As shown, when $DSA_1$ is processing a row read miss and filling the first row, $R_1$, then the contents of the refresh counter, RC, are read, indicating that row 6 should be refreshed in parallel. At the end of the combined read/refresh cycle, the first row, $R_1$, contains the data corresponding to row 2, and the refresh counter, RC, contains the address of the next row to be refreshed (i.e., row 7).

Figure 3:
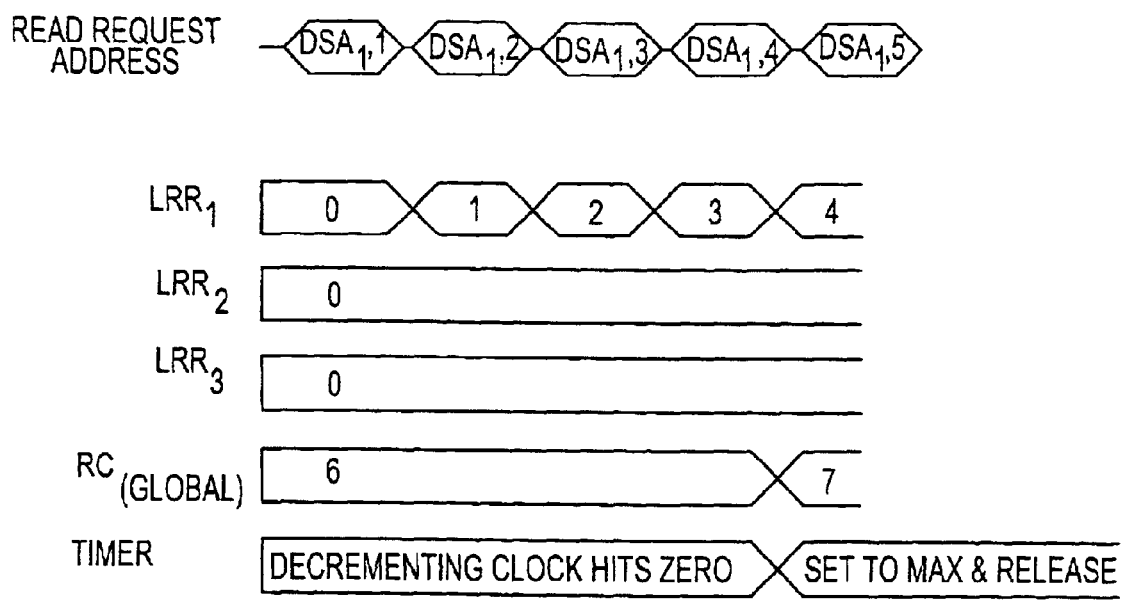
FIG. 3 is a timing diagram showing parallel read and refresh operations according to a second embodiment of the present invention.

The approach illustrated in FIG. 2, however, may adversely waste power by running refreshes excessively often. Consequently, in a second embodiment of the present invention shown in FIG. 3, the pseudo-static memory device determines whether or not an appropriate amount of time has elapsed since the last refresh cycle. A refresh cycle is run behind the given access cycle only if the time has expired. As shown in FIG. 3, consecutive read misses occur for rows 1–4 of $DSA_1$, thereby updating $R_1$ and $LRR_1$ after each miss. Unlike the timing diagram of FIG. 2, on the first read miss, a refresh cycle of at least one other sub-array does not occur since the timer has not yet decremented to zero. Instead, each clock cycle (either internal or external) the timer is decremented, thus $RC_{(global)}$ remains constant until the timer hits zero. In one implementation, the rollover of the counter sets a "refresh pending" flag, and the timer is allowed to decrement again immediately. In an alternate implementation, the timer is held at zero until the refresh occurs. In either case, the timer is eventually reset (e.g., reset to its maximum value if the timer is a down counter) to signal the length of the next period to wait.)

In FIG. 3, it is not until the fourth row miss that the timer equals zero and a refresh cycle is initiated in parallel with a next row (e.g., read) miss. After performing the refresh, $RC_{(global)}$ is incremented to its next value (i.e., 7).

Figure 4:
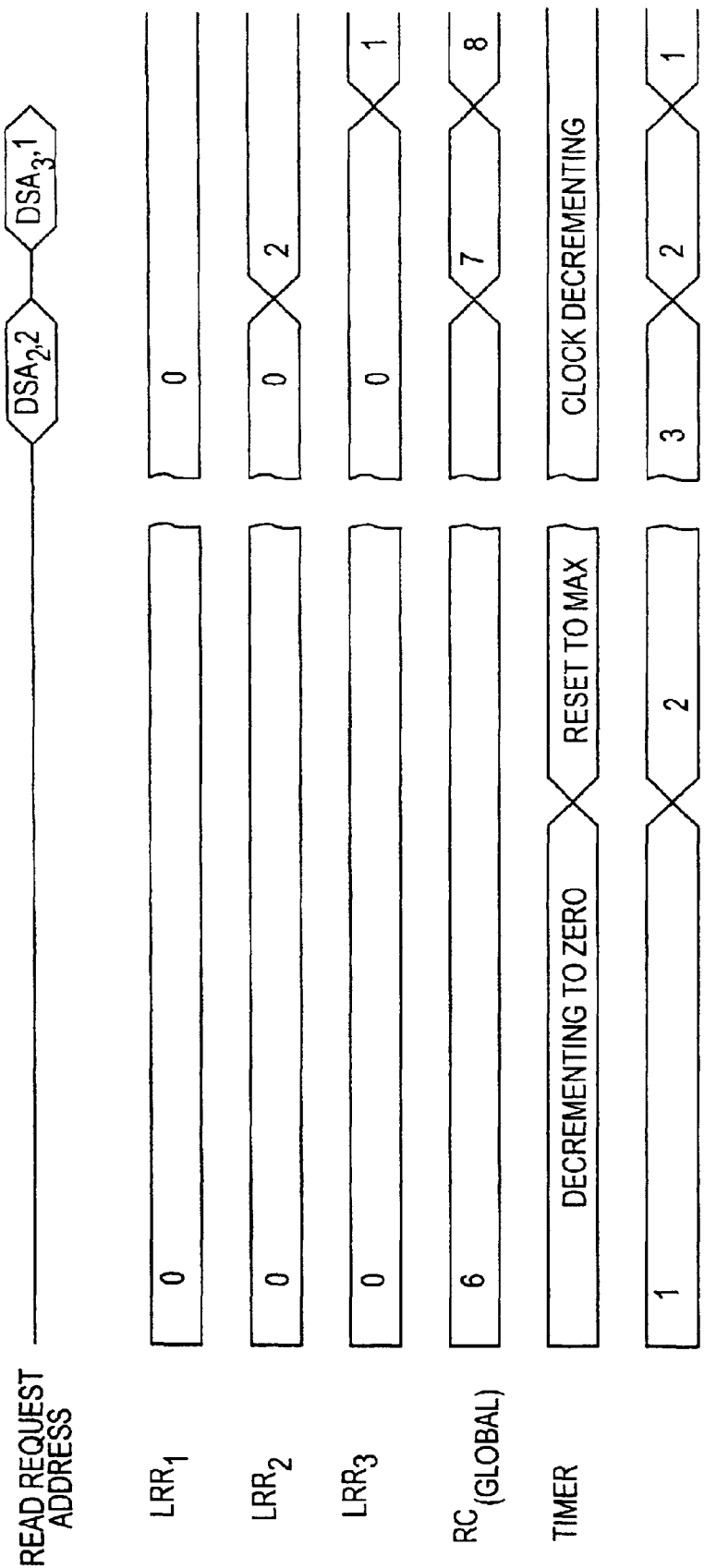
FIG. 4 is a timing diagram showing parallel read and refresh operations according to a third embodiment of the present invention.

As shown in FIG. 4, a third embodiment of the present invention includes both a counter and a timer. The counter acts as a running total of the number of refresh cycles that were missed because a hidden refresh did not occur recently and is referred to herein as a "missed refresh counter" (hereinafter "MRC"). In that configuration, a timer is coupled to an internal or external clock signal, and the value stored in MRC is incremented every time the timer resets. While the value stored in MRC is zero, the third embodiment acts like the embodiment of FIG. 3. However, after MRC accumulates at least one missed refresh cycle, the control circuitry provides a hidden refresh cycle during the next opportunity, to a block other than the one requested by the refresh address, regardless of the value of the timer. After performing the refresh cycle, the value in MRC is decremented to indicate that the control circuitry has "caught up" by one refresh cycle. Subsequent hidden refreshes occur again when possible until the value in MRC is decremented to zero. In a variation of the third embodiment, MRC is used to implement a burst of refreshes, as needed, upon entry into any device mode when internally initiated refreshes are allowed (e.g., a sleep mode).

Figure 5:
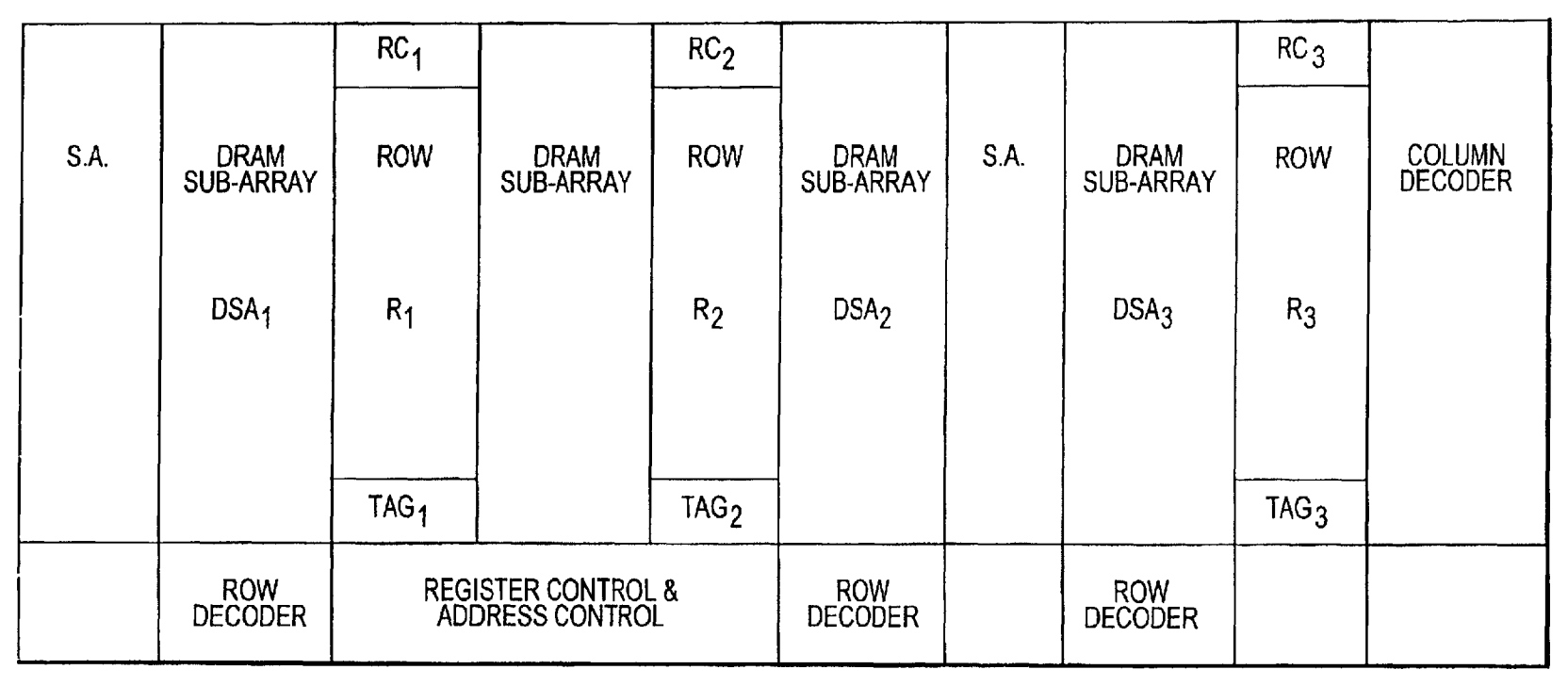
Figure 6:
FIG. 6 is a timing diagram showing parallel read and refresh operations according to a fourth embodiment of the present invention.
Figure 6:
Figure 6:
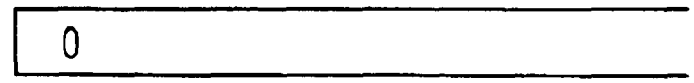
Figure 6:
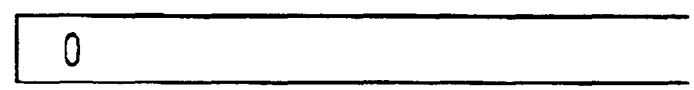
Figure 6:
Figure 6:
Figure 6:

It should be noted that the ability to hide a refresh cycle behind an access is contingent upon the ability to have the refresh cycle occur for an address in a different DRAM sub-array than the sub-array where the access is occurring. However, if a series of accesses are directed to a first DRAM sub-array, then the other sub-arrays are being refreshed properly, but the first sub-array is not. Accordingly, as shown in FIG. 5, a fourth embodiment of the present invention includes separate refresh counters for each sub-array. This prevents a row in the first sub-array from being "skipped" when the corresponding row is refreshed in the other sub-arrays. As shown in FIG. 6, when a read miss occurs in $DSA_1$, refreshes in $DSA_2$ and $DSA_3$ are performed and their corresponding refresh counters (i.e., $RC_2$ and $RC_3$) are updated. However, the value stored in $RC_1$ is left unchanged, so that no rows in $DSA_1$ are skipped for refresh.

In a fifth embodiment of the present invention, in addition to having a dedicated refresh counter per sub-array, each sub-array further includes a missed refresh counter (MRC). By tracking how far behind any sub-array is, each sub-array can "catch up" on missed refresh cycles without refreshing a row in all the sub-arrays, which would otherwise expend excess energy. For example, if a first sub-array (of four sub-arrays) is behind three cycles, a second sub-array is behind two cycles, and a third sub-array is behind one cycle, all three sub-arrays can "catch up" in parallel if the next read miss is to the sub-array that is not behind. After decrementing the corresponding MRCs, only two sub-arrays will be behind. Those remaining two sub-arrays can be updated when possible, and, if it was possible to update those two sub-arrays simultaneously, the last sub-array is updated by itself subsequently.

The embodiments above described can logically be considered an n-way grouping (e.g., 3-way grouping in FIGS. 1A and 1B) with a single DRAM sub-array per group. However, the method and structure of the present invention can be expanded to include groupings with plural sub-arrays per group, as shown in FIG. 7. In such a hierarchical embodiment, group refreshes can be performed (1) one sub-array per group per refresh cycle, (2) plural, but not all, sub-arrays per group per refresh cycle, or (3) all sub-arrays per group per refresh cycle. It is also possible to select a first one of three group refreshing techniques for one group while selecting a second group refreshing technique for a second group. Moreover, the groups need not be refreshed at the same time. It is possible to either refresh all groups simultaneously (with each group refreshing at least one sub-array), or refresh individual groups individually based on the needs of that group. It is to be understood that attempting to refresh all sub-arrays simultaneously may lead to excessive current draw. As a result, the preferred embodiment does not refresh all possible sub-arrays of all groups simultaneously. Moreover, the hierarchy is not limited to a second-order hierarchy (i.e., a hierarchy of groups and sub-arrays). Any number of sub-arrays can be formed into a sub-group, and plural sub-groups can be formed into a group, with plural groups being formed into a super-group, etc.

In the most complex refreshing technique of a second-order hierarchy, each sub-array of each group includes a refresh counter ($RC_{i,j}$) and a corresponding missed refresh counter ($MRC_{i,j}$). Thus, in the embodiment illustrated in FIG. 7, on two consecutive row read misses corresponding to $DSA_{4,1}$, it is possible to perform two consecutive sets of refresh operations. In parallel with the first row read miss, the following rows are illustratively refreshed: the row referenced by $RC_{1,1}$ of $DSA_{1,1}$, the row referenced by $RC_{2,2}$ of $DSA_{2,2}$, both of the rows referenced by $RC_{3,1}$ of $DSA_{3,1}$ and $RC_{3,2}$ of $DSA_{3,2}$, and the row referenced by $RC_{4,2}$ of $DSA_{4,2}$, (resulting in a value of zero in $MRC_{4,2}$). For each of the $RC_{i,j}$'s that were accessed, their values are incremented by one. Then, in parallel with the second row read miss, the following rows are illustratively refreshed: the row referenced by $RC_{1,2}$ of $DSA_{1,2}$, the row referenced by $RC_{2,1}$ of $DSA_{2,1}$, and both of the rows referenced by $RC_{3,1}$ of $DSA_{3,1}$ and $RC_{3,2}$ of $DSA_{3,2}$. It is noted that the row referenced by $RC_{4,2}$ of $DSA_{4,2}$ is not refreshed unless the timer is zero since $DSA_{4,2}$ has caught up to all missed refreshes.

Figure 8:
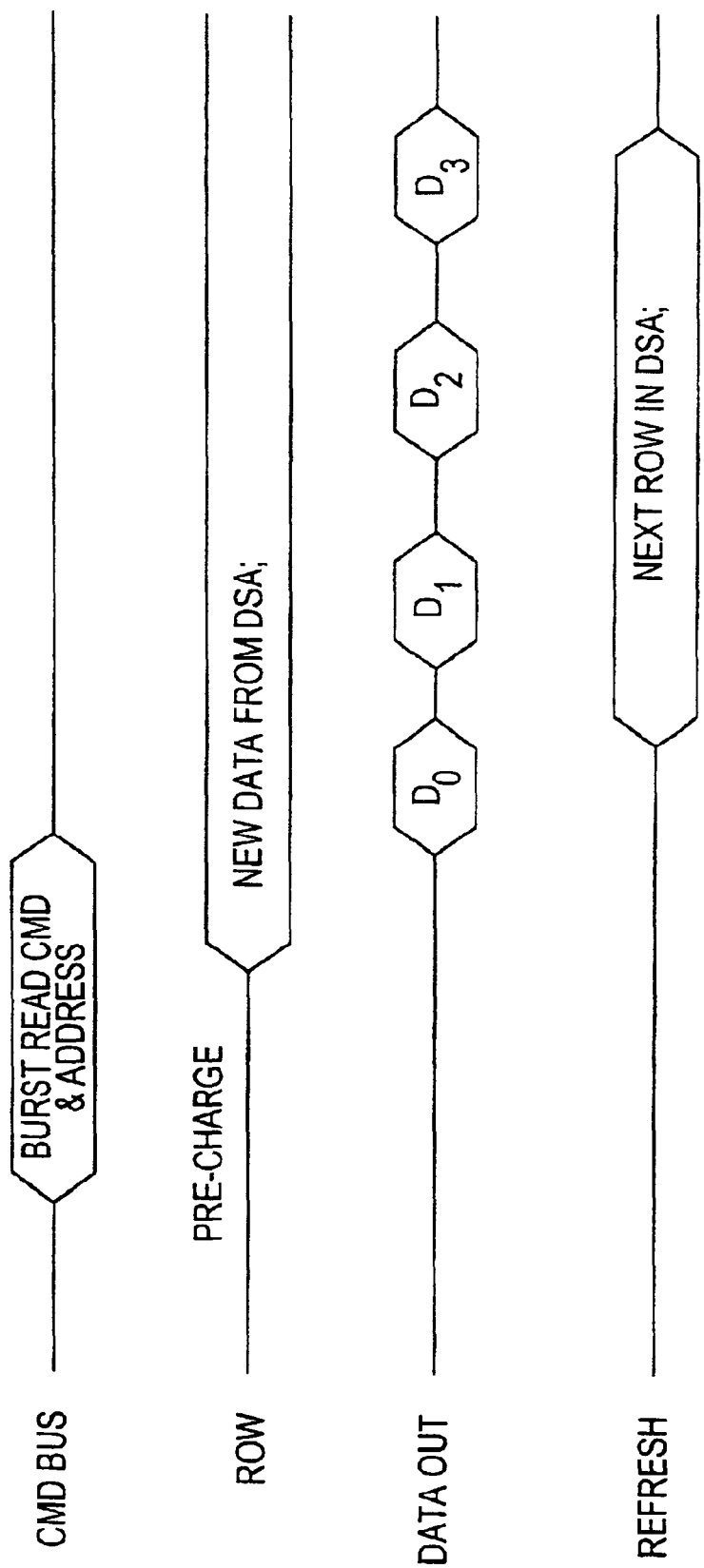
FIG. 8 is a timing diagram showing parallel read and refresh operations according to a sixth embodiment of the present invention.

As shown in FIG. 8, a sixth embodiment of the present invention analyzes the type of command to be performed to further hide at least one refresh cycle for the sub-array being addressed. In a burst read operation that produces a row read miss, data is read from a DRAM sub-array ($DSA_i$) and loaded into a corresponding row ($R_i$). Since the burst read is guaranteed to perform plural consecutive reads, an interruption-free refresh operation can be performed on $DSA_i$ since $R_i$ is providing the data for the burst. In the illustrated example, the four data words (or bits) are output in parallel with a refresh of the next row in $DSA_i$, but the refresh is performed serially as compared to the row filling operation. (This type of refresh operation is referred to hereinafter as a "serial refresh operation.") By extending the number of words (or bits) output in any burst, the number of rows that can be serially refreshed per burst increases. For example, it may be possible to hide at least two serial refresh cycles behind a burst read of 8 words (or bits).

Moreover, a burst write operation may likewise provide an opportunity for serial refresh operations. While a row $R_i$ is being filled with data corresponding to a burst write, at least one row (depending on the size of the burst) of $DSA_i$ can be refreshed.

In a seventh embodiment of the present invention, the control circuitry for performing parallel refreshes and the control circuitry for performing serial refreshes is combined to provide a high number of refreshed rows in burst accesses. In addition to the refresh operations that can be performed in the first through fifth embodiments, additional refresh operations of non-accessed sub-arrays can be performed in parallel with the serial refresh operations. For example, in an n-way grouping with one sub-array per group, while $R_i$ is being filled by $DSA_i$, a maximum of n-1 refresh operations can be performed in parallel for $DSA_j$ where i≠j. Then, during the burst read, one row for, at most, each of the n sub-arrays at a time can be refreshed while data is read from $R_i$, but fewer rows can be refreshed if a power consumption checking circuit determines that a maximum power (or current) draw would be exceeded.

If a write row is provided as well, the opposite refreshing schedule would be used during a burst write operation. That is, a maximum of n rows could be refreshed while the data is being written to $R_i$, then a maximum of n-1 refresh operations at a time could be performed in parallel with writing the data from $R_i$ to $DSA_i$.

In order to reduce the possibility that any one sub-array will become too far behind in its refreshes, in a variation of the first through seventh embodiments disclosed herein, the address decoders are configured to put logically adjacent rows in different sub-arrays. For example, in a row of 128 bits, binary addresses XXX00XXXXXXX are stored in a first sub-array, binary addresses XXX01XXXXXXX are stored in a second sub-array, binary addresses XXX10XXXXXXX are stored in a third sub-array, and binary addresses XXX11XXXXXXX are stored in a fourth sub-array, where "X" represents a "don't care" in the address. Thus, by consecutively referencing all memory locations between 000000000 and 111111111111, the memory device will cycle between sub-arrays 0, 1, 2, and 3 and then return to zero eight times. Using a linear addressing scheme, 1024 consecutive operations would occur for $DSA_1$ followed by 1024 consecutive operations for $DSA_2$, etc., and data could be lost during those bursts.

FIG. 9 illustrates the row addresses stored in each of the first, second, third, and fourth sub-arrays according to the above addressing example. The FIG. 9 shows an expansion of the row addresses in each sub-array per the addressing example. Thus, the figure shows an expansion of addresses of the form XXX00XXXXXX stored in the first sub-arry. Likewise, the figure shows an expansion of addresses of the form XXX10XXXXXX stored in the third sub-array. Finally, the figure the figure shows an expansion of addresses of the form XXX11XXXXXX stored in the fourth sub-array.

The present invention can utilize a number of different conditions to trigger an internal examination as to whether a refresh cycle should be performed. The memory device receives commands (e.g., in the form of an explicit command sent to the memory or in the form of the assertion or de-assertion of a signal on an external pin) that are decoded internally by the memory device. For example, a read command issued to the memory device can be decoded to determine if, for example, (1) if it is time to hide a refresh behind a read from a non-array row or (2) if it is time to hide a refresh of an array row of a first sub-array behind an access to an array row of a second sub-array. Similarly, upon receipt of a command in the form of a refresh signal on a refresh pin, the memory device may decide internally that an insufficient amount of time has passed (or that power considerations would make it inadvisable to perform a refresh at the requested time), and the memory device blocks a refresh from occurring in response to that command. Other commands that can be decoded include, but are not limited to, write requests and chip deselects.

Obviously, numerous modifications and variations of the present invention are possible in light of the above teachings. It is therefore to be understood that, within the scope of the appended claims, the invention may be practiced otherwise than as specifically described herein.

What is claimed is:

1. A memory device having plural DRAM sub-arrays, each with plural array rows, comprising:
   an address decoder for decoding an address of a memory access request and indicating which of the plural DRAM sub-arrays are referenced by the memory access request; and refresh circuitry, responsive to the indication of the address decoder, to refresh at least one array row of at least one of the plural DRAM sub-arrays not referenced by the memory access request while contemporaneously performing the memory request, wherein logically adjacent rows are placed in different sub-arrays, wherein a first row is in a first sub-array and a second row is in a second sub-array, the second row being one logical row from the first row, and a third row is in the first sub-array and a fourth row is in the second sub-array, the fourth roar being one logical row from the third row, wherein the first row is not logically adjacent to the third row.

2. The memory device as claimed in claim 1, wherein the memory access request comprises a read access request.

3. The memory device as claimed in claim 2, further comprising a non-array row, external to the DRAM sub-arrays, for receiving from the DRAM sub-array referenced by the address of the read access request at least a portion of an array row corresponding to the address of the read access request.

4. The memory device as claimed in claim 3, further comprising:
   a tag register for storing at least a portion of the address of a read access request that last stored information into the non-array row; and
   a comparator for signaling that the read access request may be serviced from the non-array row rather than the array row corresponding to the address of the read access request.

5. The memory device as claimed in claim 1, wherein the memory access request comprises a write access request.

6. The memory device as claimed in claim 5, further comprising a non-array row, external to the DRAM sub-arrays, for storing, prior to writing to the DRAM sub-array referenced by the address of the write access request, at least a portion of an array row corresponding to the address of the write request.

7. The memory device as claimed in claim 1, wherein the refresh circuitry comprises a refresh counter for storing a next array row to be refreshed in at least one of the plural DRAM sub-arrays.

8. The memory device as claimed in claim 1, wherein every other logically adjacent row resides on a separate sub-array.

9. The memory device as claimed in claim 1, wherein even numbered rows and odd numbered rows reside on separate sub-arrays.

10. A method of refreshing a memory device having a plural DRAM sub-arrays, each with plural array rows, the method comprising:
    (a) placing logically adjacent rows in different sub-arrays, wherein a first row is in a first sub-array and a second row is in a second sub-array, the second row being one logical row from the first row, and a third row is in the first sub-array and a fourth row is in the second sub-array, the fourth row being one logical row from the third row, wherein the first row is not logically adjacent to the third row;
    (b) decoding an address of a memory request;
    (c) indicating which of the plural DRAM sub-arrays are referenced by the memory access request;
    (d) refreshing, in response to the indicating step, at least one array row of at least one of the plural DRAM sub-arrays not referenced by the memory access request; and
    (e) executing the memory address request,
    wherein steps (d) are performed contemporaneously.

11. The method as claimed in claim 10, wherein the memory access request comprises a read access request.

12. The method as claimed in claim 10, further comprising:
    receiving, into a non array row external to the plural DRAM sub-arrays and from the DRAM sub-array referenced by the address of the read access request, at least a portion of an array row corresponding to the address of the read request.

13. The method as claimed in claim 10, wherein the memory access request comprises a write access request.

14. The method as claimed in claim 13, further comprising storing into a non-array row, external to the DRAM sub-arrays, prior to writing to the DRAM sub-may referenced by the address of the write access request, at least a portion of an array row corresponding to the address of the write request.

15. The method as claimed in claim 10, further comprising updating a refresh counter to store a next array row to be refreshed in at least one of the plural DRAM sub-arrays.

16. A memory device having plural DRAM sub-arrays, each with plural array rows, comprising:
    an address decoder for decoding an address of a memory access request and indicating which of the plural DRAM sub-arrays are referenced by the memory access request; and
    refresh circuitry, responsive to the indication of the address decoder, to refresh at least one array row of at least one of the plural DRAM sub-arrays not referenced by the memory access request while contemporaneously performing the memory request, wherein logically adjacent rows are placed in different sub-arrays, and the logically adjacent rows in different sub-arrays comprise rows other than the last and first rows of consecutive sub-arrays, wherein each sub-array includes rows that are not logically adjacent.

17. A method of refreshing a memory device having a plural DRAM sub-arrays, each with plural array rows, the method comprising:
    (a) placing logically adjacent rows in different sub-arrays and the logically adjacent rows in different sub-arrays comprise rows other than the last and first rows of consecutive sub-arrays, wherein each sub-array includes rows that are not logically adjacent;
    (b) decoding an address of a memory request;
    (c) indicating which of the plural DRAM sub-arrays are referenced by the memory access request;
    (d) refreshing, in response to the indicating step, at least one array row of at least one of the I plural DRAM sub-arrays not referenced by the memory access request; and
    (e) executing the memory address request,
    wherein steps (d) and (e) are performed contemporaneously.

* * * * *

UNITED STATES PATENT AND TRADEMARK OFFICE
CERTIFICATE OF CORRECTION

| | | |
|---|---|---|
| PATENT NO. | : 7,085,186 B2 | Page 1 of 1 |
| APPLICATION NO. | : 09/828283 | |
| DATED | : August 1, 2006 | |
| INVENTOR(S) | : Kenneth J. Mobley | |

It is certified that error appears in the above-identified patent and that said Letters Patent is hereby corrected as shown below:

Claim 1, col. 7, line 11, replace "fourth roar" with -- fourth row --.

Claim 17, col. 8, line 55, replace "the I plural DRAM" with -- the plural DRAM --.

Signed and Sealed this

Twenty-seventh Day of April, 2010

David J. Kappos
*Director of the United States Patent and Trademark Office*